(12) United States Patent
Berger et al.

(10) Patent No.: US 8,120,753 B2
(45) Date of Patent: Feb. 21, 2012

(54) METHOD, PROGRAM PRODUCT AND APPARATUS FOR GENERATING A CALIBRATED PUPIL KERNEL AND METHOD OF USING THE SAME IN A LITHOGRAPHY SIMULATION PROCESS

(75) Inventors: Gabriel Berger, Cupertino, CA (US); Tamer Coskun, Cupertino, CA (US); Sangbong Park, Union City, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 522 days.

(21) Appl. No.: 11/979,839

(22) Filed: Nov. 8, 2007

(65) Prior Publication Data
US 2008/0204690 A1 Aug. 28, 2008

Related U.S. Application Data

(60) Provisional application No. 60/857,497, filed on Nov. 8, 2006.

(51) Int. Cl.
*G03B 27/32* (2006.01)
*G03B 27/54* (2006.01)

(52) U.S. Cl. .......................................... 355/77; 355/67
(58) Field of Classification Search .................... 355/53, 355/67, 77; 430/5, 30; 703/2, 5; 716/19–21, 716/50–56
See application file for complete search history.

(56) References Cited

U.S. PATENT DOCUMENTS

| | | | | |
|---|---|---|---|---|
| 5,229,872 | A | * | 7/1993 | Mumola |
| 5,296,891 | A | * | 3/1994 | Vogt et al. |
| 5,523,193 | A | * | 6/1996 | Nelson |
| 5,969,441 | A | * | 10/1999 | Loopstra et al. |
| 6,046,792 | A | * | 4/2000 | Van der Werf et al. |
| 7,079,223 | B2 | * | 7/2006 | Rosenbluth et al. |
| 2005/0149902 | A1 | * | 7/2005 | Shi et al. ........................ 716/21 |
| 2005/0168498 | A1 | * | 8/2005 | Granik ........................ 345/698 |
| 2005/0179886 | A1 | * | 8/2005 | Shi et al. ........................ 355/77 |

FOREIGN PATENT DOCUMENTS

| | | | |
|---|---|---|---|
| JP | 10-208993 | * | 8/1998 |
| JP | 2003-188080 | * | 7/2003 |
| JP | 2005-217431 | * | 8/2005 |
| JP | 2005-234571 | * | 9/2005 |
| JP | 2006-245454 | * | 9/2008 |
| WO | WO2005/040917 | * | 5/2005 |

OTHER PUBLICATIONS

Predictive modeling of advanced illumination pupils used as imaging enhancement for low k1 applications, Proc. SPIE, vol. 5377, 344 (2004).*

Christof T. Bodendorf, Ralph E. Schlief and Ralf Ziebold, "Impact of measured pupil illumination fill distribution on lithography simulation and OPC models", Proc. SPIE 5377, 1130 (2004).*

* cited by examiner

*Primary Examiner* — Hung Henry Nguyen
*Assistant Examiner* — Colin Kreutzer
(74) *Attorney, Agent, or Firm* — Pillsbury Winthrop Shaw Pittman LLP (57) ABSTRACT

A method of generating a model for simulating the imaging performance of an optical imaging system having a pupil. The method includes the steps of defining the optical imaging system and a process to be utilized by the optical imaging system; and defining a model equation representing the imaging performance of the optical imaging system and the process, where the model equation including a calibrated pupil kernel. The calibrated pupil kernel representing a linear model of the pupil performance.

21 Claims, 7 Drawing Sheets

Simulation results with super-Gaussian transmission CPK with different orders for line-space test pattern

METHOD, PROGRAM PRODUCT AND APPARATUS FOR GENERATING A CALIBRATED PUPIL KERNEL AND METHOD OF USING THE SAME IN A LITHOGRAPHY SIMULATION PROCESS

PRIORITY CLAIM

This application claims priority to U.S. Provisional Application Ser. No. 60/857,497, filed on Nov. 8, 2006, the contents of which are incorporated herein in its entirety.

TECHNICAL FIELD

This disclosure relates generally to lithographic simulation tools. More particularly, it relates to a method for generating a calibrated pupil kernel and utilizing the calibrated pupil kernel in a lithographic simulation process so as to allow for more accurate modeling of the imaging performance of an optical imaging system.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

Due to an accuracy requirement for optical proximity correction (OPC) at very low k1 (<0.4), more accurate representation of the performance of the exposure tool in simulations has become critical to accommodate the reduction of device pattern dimensions. As is known, the modeling of complex optical imaging and patterning processes often relies on empirical models with adjustable parameters that have to be calibrated using measured data. Such empirical models are used in photolithography and advanced imaging applications, including optical proximity correction (OPC) of layouts in photolithography, post-OPC layout verification, die-to-database photomask pattern inspection, etc. The empirical models of the imaging process have adjustable parameters that are optimized, or "calibrated", using measured data. In other words, the adjustable parameters are adjusted until the simulated imaging result matches the actual imaging result (i.e., the measured data) within some predefined error criteria. In the case of OPC in lithographic patterning, the calibration data may be, for example, CD SEM measurements of patterns from semiconductor wafers. In the case of mask inspection, the calibration data may be, for example, images of the mask measured on the inspection tool.

Although physically based models of lithographic patterning are well understood, their use in modeling full-chip designs is limited by available computation time and resources. Consequently, less complicated and more efficient empirical patterning models are typically used in OPC applications. As noted, empirical models have adjustable parameters that are optimized, or "calibrated", using measured patterns and/or critical dimension (CD) information from semiconductor wafers patterned with the lithographic process of interest. Since each empirical model does not completely capture the physics of the patterning process, its usefulness depends on how well it can match the observed measurements and predict the process behavior.

Currently, in existing prior art imaging models, the pupil performance is typically modeled by utilizing an ideal step function in which light passes unattenuated through the pupil at all pupil locations, and is fully attenuated in areas outside of the pupil. However, such a model does not accurately reflect the performance of a typical pupil. As the design requirements continue to become more demanding, there is a continuing need for the simulation models to be more accurate. As such, it is an object of the present invention to provide a method for determining and modeling a more accurate representation of the performance of the pupil in the lithographic process.

Accordingly, there exists a need for a modeling process which considers and models pupil performance so as to produce a simulation model capable of producing simulation results exhibiting increased accuracy relative to the actual pupil performance.

SUMMARY

In view of the foregoing deficiencies in the prior art imaging models, the present invention relates to a method of generating a calibrated pupil kernel and utilizing the calibrated pupil kernel in a lithographic simulation process so as to allow for more accurate modeling of the imaging performance of an optical imaging system. In particular, as noted in more detail below, the present invention models the pupil performance utilizing a calibrated linear function, which represents actual pupil performance during the imaging process. As a result, a more accurate imaging model and more accurate imaging results are produced.

More specifically, the present invention relates to a method of generating a model for simulating the imaging performance of an optical imaging system having a pupil. The method includes the steps of defining the optical imaging system and a process to be utilized by the optical imaging system; and defining a model equation representing the imaging performance of the optical imaging system and the process, where the model equation includes a calibrated pupil kernel. In the given embodiment, the calibrated pupil kernel represents a linear model of the pupil performance.

As explained in more detail below, the method of the present invention provides significant advantages over the prior art. Most importantly, the present invention provides an imaging model which utilizes a linear function to represent the actual performance of the pupil in the optical imaging system. As a result, a more accurate imaging model is produced, which benefits all applications utilizing such simulation processes. For example, increased model accuracy results in improved OPC application and verification, which are important aspects of the mask design process.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

The invention itself, together with further objects and advantages, can be better understood by reference to the following detailed description and the accompanying drawings.

DETAILED DESCRIPTION

As noted above, the present invention relates to a method of generating a calibrated pupil kernel that more accurately represents the performance of the pupil in the imaging process, and as a result can be utilized in an imaging simulation model to produce a more accurate simulation result.

More specifically, a calibrated pupil kernel (CPK) of the present invention is a quasi-physical function utilized, for example, to improve resist calibration accuracy and predictive power, and to compensate for inaccuracies in the mask representation, mask model, or pupil model of a given lithography simulation system. While unaberrated pupils are modeled as simple circ functions (i.e., ideal step functions), such a model is limited. The CPK represents an improvement over the typically model utilized for representing pupil performance.

As explained in further detail below, the calibrated pupil kernel is designed to modify the electric field coming from each coherent illumination point just after exiting the pupil. It may be constant as a function of illumination angle, or it may shift spatially in the pupil plane as a function of angle. While the CPK can be a nonlinear function, in the given embodiment, the CPK is represented utilizing a linear function which acts by point wise multiplication on the electric fields passing through it.

Prior to discussing the CPK in more detail, a general overview of the background associated with diffraction is provided. Assuming a thin mask approximation and a mask with complex transmission function $m(x,y)$, and letting $\lambda$ represent the wavelength of light used in the illumination system, letting z denote the distance between the mask and the pupil and considering an on-axis plane wave passing through the mask, for a given point $(x', y')$ in the entrance to the pupil, Frauenhofer scalar diffraction provides that the scalar field can be determined up to a global normalization factor by:

$$M_0(x',y') = \iint m(x,y) e^{-2\pi i (f_x^* x + f_y^* y)} dx dy$$

where $fx=x'/(\lambda z)$, $fy=y'/(\lambda z)$, and both integrals extend from $-\infty$ to $\infty$.

Now considering a wave emanating from a point with coordinates $\sigma=(\sigma x, \sigma y)$, where the point $\sigma$ is normalized to have length $1/\lambda$. In this case, the scalar field becomes:

$$M_\sigma(x',y') = M0(x',y') e^{2\pi i(\sigma x^* x + \sigma y^* y)} = M0(x'-\lambda z \sigma_x, y'-\lambda z \sigma_y)$$

which is just a shift of the original on-axis field.

The pupil changes the electric field by both blocking out diffraction orders with higher spatial frequency than the numerical aperture of the lens and changing the field's phase. In an unaberrated lens, the effect of the phase change is such that as the field hits the wafer, the phase is the inverse Fourier transform of the field exiting the pupil. In an aberrated lens, there are additional phase changes that should be accounted for in the model/description of the pupil. Taking this into account, the field as it exits the pupil will be given by:

$$M_\sigma(x',y') H(f_x,f_y),$$

where:

$$H(f_x,f_y) = circ(\lambda^* (f_x^* f_x + f_y^* f_y)^{-5}/NA) e^{-2\pi i W(f_x,f_y)},$$

and $W(fx, fy)$ is the aberration function. The electric field as it hits the wafer is then given by:

$$E_\sigma(x,y) = FFT^{-1}(M_\sigma(x',y') H(f_x,f_y)),$$

and its contribution to the aerial image is given by $|E_\sigma(x,y)|^2$.

Figure 1:
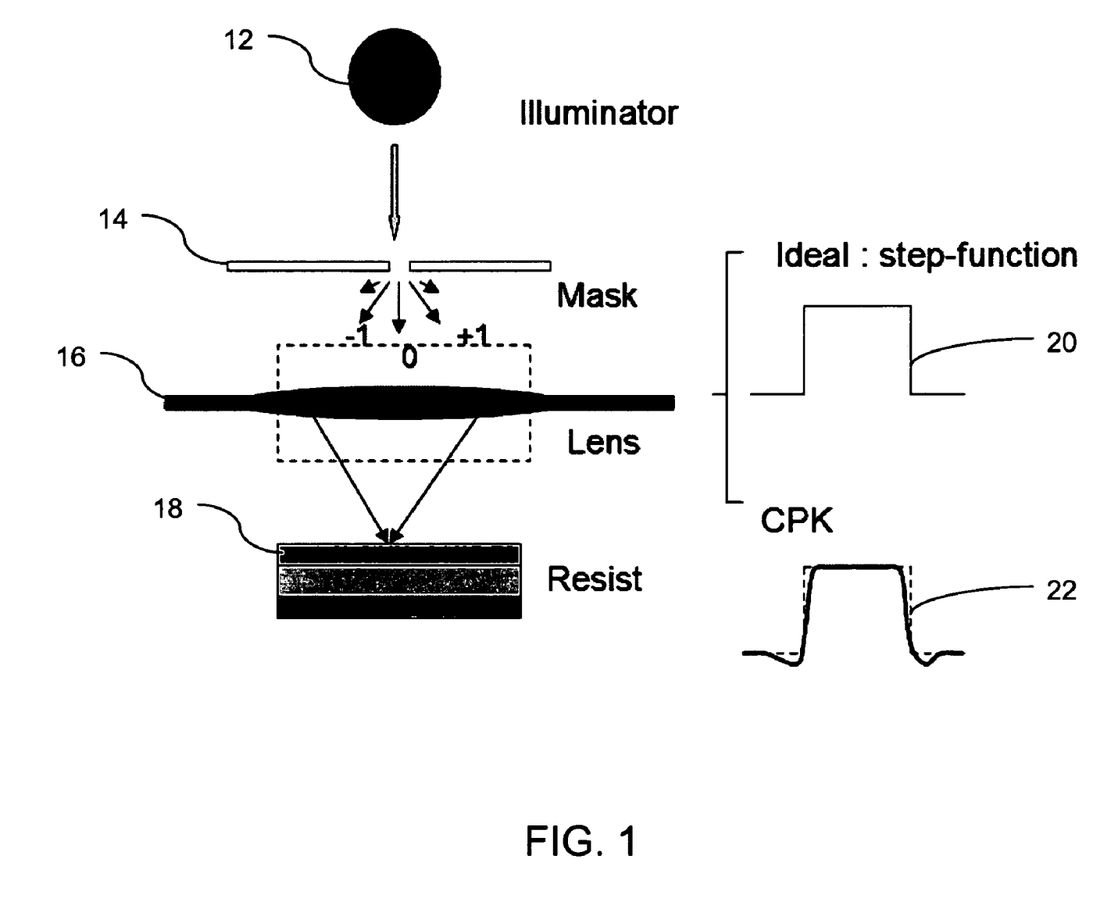
FIG. 1 illustrates an example of the basic illumination process, as well as a typical prior art model of the pupil element and an example of a CPK model.

FIG. 1 illustrates an example of the basic illumination process, as well as a typical prior art model of the pupil element and an example of a CPK model. Referring to FIG. 1, an illumination source 12 is utilized to illuminate a mask 14 (i.e., reticle), and the light passing through the mask is then captured by the lens 16 (also referred to as the pupil). The light captured by the pupil is then transferred to the wafer 18 so as to image the resist film formed on the top portion of the wafer 18. As noted above, in prior art models, an ideal step function 20 as shown in FIG. 1 was typically utilized to model the performance of the pupil 16. In contrast, in the present invention, a CPK function 22, an example of which is shown in FIG. 1, is utilized to model the performance of the pupil 16. As shown from the example of FIG. 1, the CPK function varies from the ideal step function so as to more closely represent the actual performance of the pupil.

In the given embodiment, when generating the CPK function, the expression:

$$M_\sigma(x',y') H(f_x,f_y),$$

is multiplied by a function $p_\sigma(f_x, f_y)$. There are two basic cases to consider regarding $p_\sigma(f_x, f_y)$:

1) $p_\sigma(f_x, f_y) = p(f_x, f_y)$ is independent of $\sigma$. This case corresponds to an empirical pupil filter, which may be interpreted as a correction for deviations in the pupil from the simple top-hat model given by the circ function, and 2) $p_\sigma(f_x, f_y) = p(f_x - \sigma_x, f_y - \sigma_y)$ which is the shift of a function p, and which is independent of $\sigma$. This case corresponds to a function, which may be interpreted as a correction for mask errors which are not modeled or for mask model errors.

By the duality between multiplication and convolution under Fourier transform, the electric field $E\sigma(x,y)$, as it is incident on the wafer, will be transformed by a CPK to $E_\sigma(x,y) * P_\sigma(x,y)$, where $P_\sigma(x,y)$ is the Fourier transform of the CPK and * is the convolution operator. The foregoing is a linear transformation of $E_\sigma(x,y)$, and so its affect on intensity will be quadratic. The fact that the affect of the CPK is quadratic holds regardless of whether an aerial image or the affects of a thin film stack are being considered.

Once the CPK function is defined as set forth above, it is necessary to select a representation for the CPK and to calibrate the function. Two possible types of calibrated pupil kernel representations are parametric representations and pixel-based representations. It is noted that in the following discussions, the pupil coordinate system will be renormalized so that the values of x and y are 1 at the boundary of the circ function.

Figure 2A:
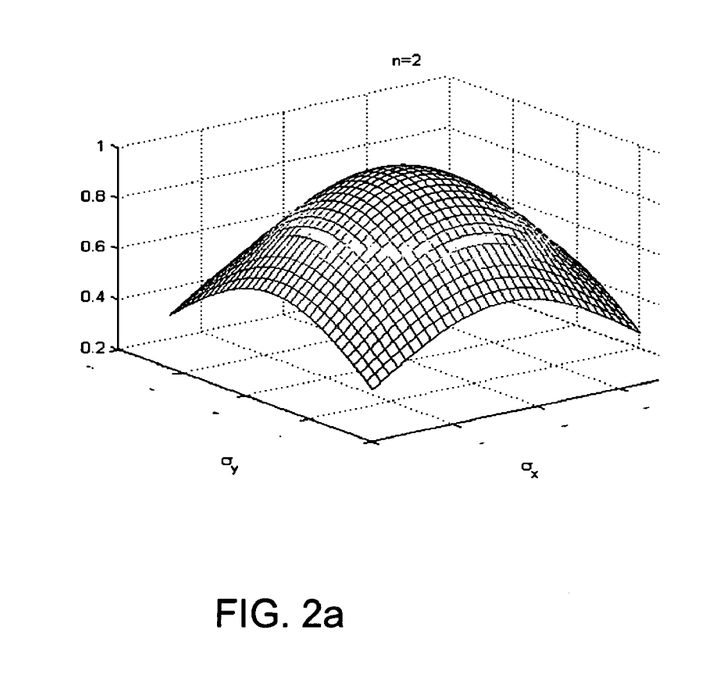
FIGS. 2a and 2b illustrate graphic examples of exemplary transmission CPKs.
Figure 2B:
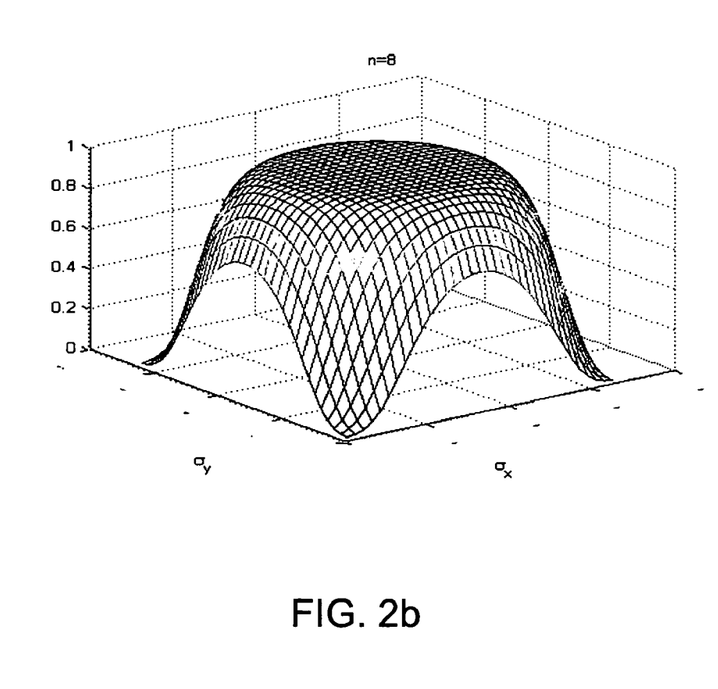

With regard to parametric representations of CPK, it is noted that there are many ways to parameterize a CPK. Factors to consider include, but are not limited to, the number of desired parameters and the aggressiveness of the desired shape. It is possible to parameterize both the real and imaginary parts of the CPK. Examples of possible parametric representations include, but are not limited to: (a) piecewise-linear radially symmetric functions—a typical example of such a function is one determined by its value and slope at the boundary of the circ function (which is 1 in the renormalized coordinate system) and the fact that its maximal obtainable value is 1; (b) super-Gaussian radially symmetric functions—for given parameters B, k, and n, these are functions of the form $B^* e^{\phi(k,n;r)}$, where $\phi(k,n;r) = k^*(1-r^n)$, (when n=2, this is just a Gaussian function); (c) non-radially symmetric functions such as disclosed above—with such functions it is possible to calibrate the parameters in the x- and y-directions and then interpolate at arbitrary positions; (d) Chebyshev polynomials—in which an arbitrary function is expressed as a sum of a set of fixed polynomials with varying coefficients; and (e) Zernike polynomials with calibrated coefficients. FIGS. 2a and 2b illustrate graphically examples of transmission CPKs.

Figure 3:
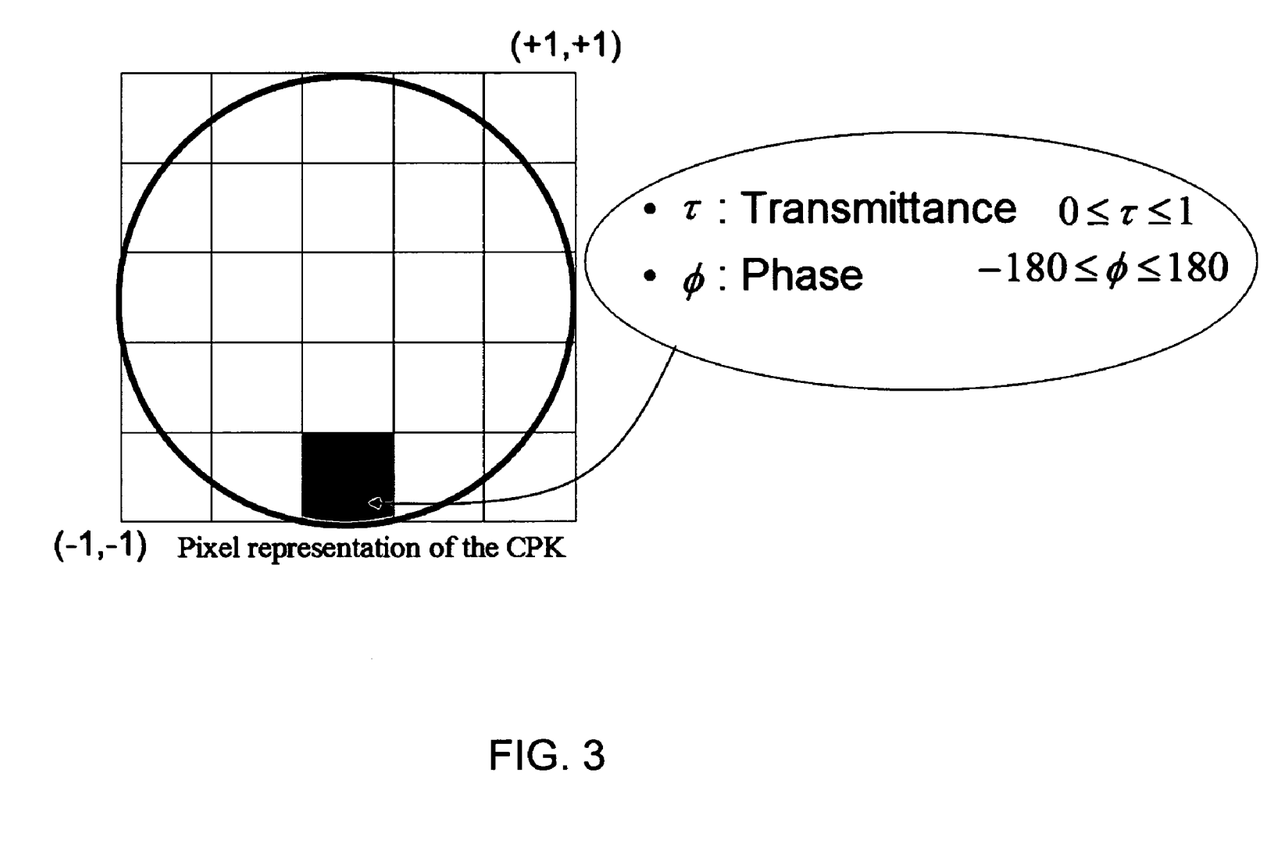
FIG. 3 illustrates an exemplary application of the pixel-based representation, in which the defined circle is divided into a plurality of pixels 32 having the same size.

Turning to pixel-based representations, with a pixel-based representation of the CPK it is necessary to divide up the interior of the circle of radius 1 (corresponding to the pupil)

into pixels of a fixed size. Each pixel will then be assigned a complex value. During calibration, it is possible to fix the values of certain pixels. As one example, it is possible to set the value of the pixels in the interior of the circle far from the boundary at a value 1 and then calibrate only the pixels near the boundary. FIG. 3 illustrates an exemplary application of the pixel-based representation, in which the defined circle is divided into a plurality of pixels 32 having the same size. The value of each of the pixels is then defined/determined during the calibration process. Each of the pixels may have a transmittance τ ranging from $0 \leq \tau \leq 1$, and a phase shift ranging from $-180 \leq \phi \leq 180$.

Once the representation of the CPK is selected, the next step in the process is to calibrate the CPK function. There are multiple methods of calibrating the CPK function, all of which can accommodate either 1-dimensional or 2-dimensional calibration methods. The methods include: (a) performing calibration with an existing resist model; (b) calibration without an existing resist model, followed by calibration of the resist model to the optical system including the CPK; and (c) a hybrid calibration method.

With regard to the first calibration technique, calibration with an existing resist/imaging model, this technique is accomplished by determining the optimal set of parameters of the CPK function, where the evaluation metric for a given parameter set is the difference (e.g., RMSE, min-max, etc., possibly with feature weighting) between CD values calculated with the CPK function corresponding to the parameter set and a set of reference values which are obtained, for example, from an actual imaging process. If a 2-dimensional calibration process is being utilized, the metric could be, for example, the normalized intersection area between the simulated and reference contours. CPK function is essentially another variable in the resist/imaging model being utilized, and the parameters of the CPK function are varied until the simulated result of the model including the CPK function matches the actual imaging results of the lithography process being model within some predefined error condition. It is noted that this calibration technique is preferred with parametric CPKs, since the technique is computationally intensive and parametric CPKs have fewer parameters to calibrate.

Turning to the second technique disclosed above, calibration of the CPK without a resist model, the steps in the process include creating a target intensity profile which is 1 where the feature doesn't print and 0 otherwise (for negative resists, this is reversed). Then, a metric is defined, such as for example, the L1 norm, to define the difference between the target intensity profile and the simulated intensity profile using the CPK. As stated previously, this is quadratic in the CPK. Thus, even if the CPK contains many parameters (e.g., in the case of a pixel-based representation), calibration reduces to quadratic optimization, which is not as computationally demanding as full-scale simulation involving exposure and development. It is further noted that it is possible to specify regions of interest using a weighting mechanism. More specifically, if a weight w(x,y) is assigned to each point on the wafer, the metric becomes:

$$\iint w(x,y) |I_{sim}(x,y) - I_{target}(x,y)| dx dy$$

In practice, the weight function will usually be non-zero near a feature and zero away from the feature. It is further noted that the non-zero weights can all be 1 or can be varied to assign more importance to certain features.

Turning to the third calibration technique noted above, it is also possible to use a resist model as an aid in calibrating the CPK and then utilize the CPK to recalibrate the resist model if desired. A typical flow of operation in this technique is as follows. First, a target intensity function is generated as in the previous technique. Next, use an existing resist model to improve the target intensity function. This is essentially the same as giving an approximate solution to the inverse resist problem. In other words, one searches for the intensity profile that would best match the measured resist contours upon development. As a simple solution to such a task, it is possible to consider dilating/eroding the contour boundaries and/or convolving the target intensity profile with a Gaussian. Then, the existing resist model is utilized to calibrate the optimal dilation lengths and diffusion lengths relative to the measured contours. Thereafter, the steps of the calibration process without a resist model are performed, but utilizing this new resist model-aware target intensity profile instead of the original one. Finally, the resist model is recalibrated using the new CPK function. This final step may not be necessary if the inverse resist problem solution captures enough information about the resist model.

It is noted that the calibration process may be performed through different defocus conditions and at multiple planes in the resist image so as to obtain a further improvement in model performance and simulated imaging results.

Figure 4:
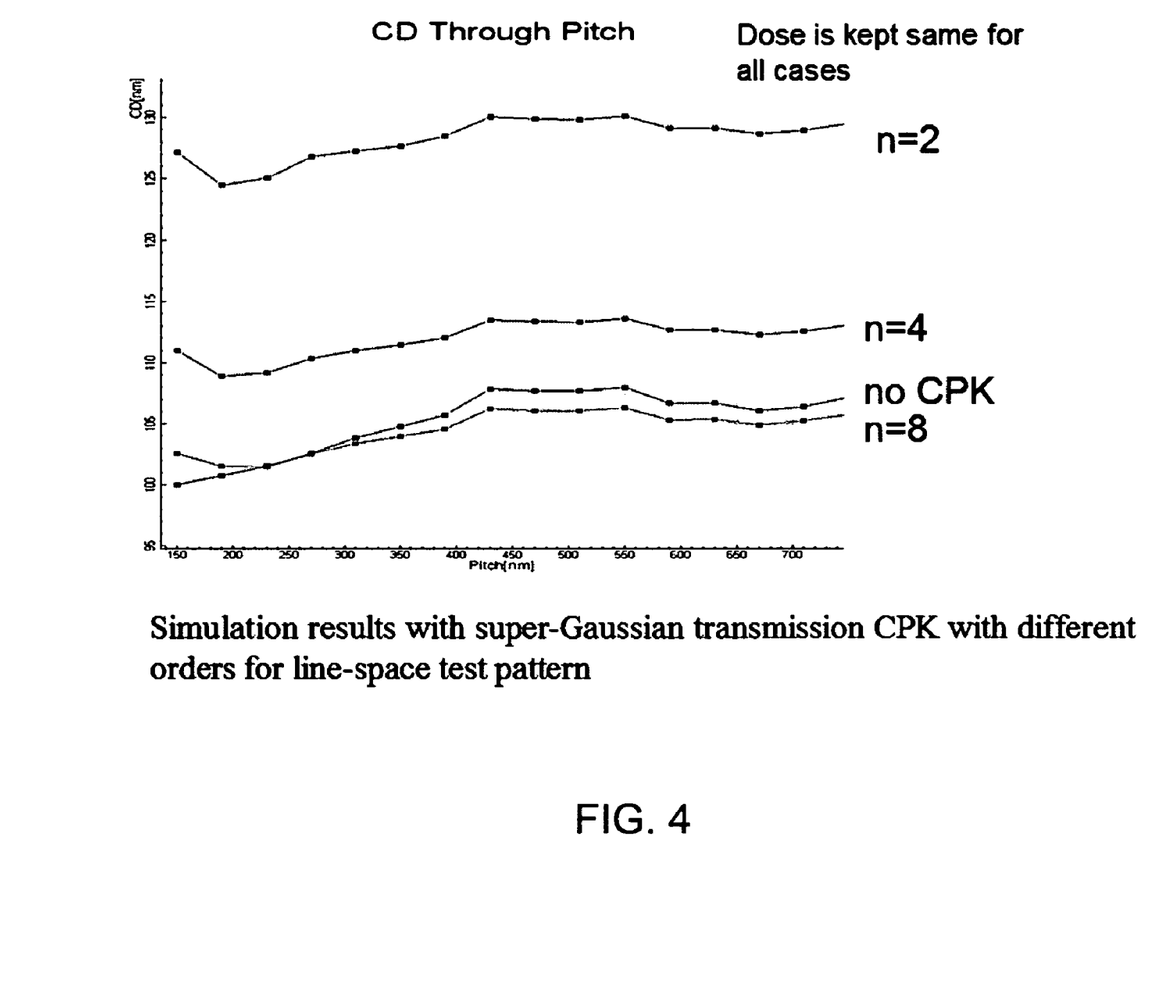
FIG. 4 illustrates exemplary simulation results of a super-Gaussian transmission CPK with different orders for a line-space test pattern.
Figure 5A:
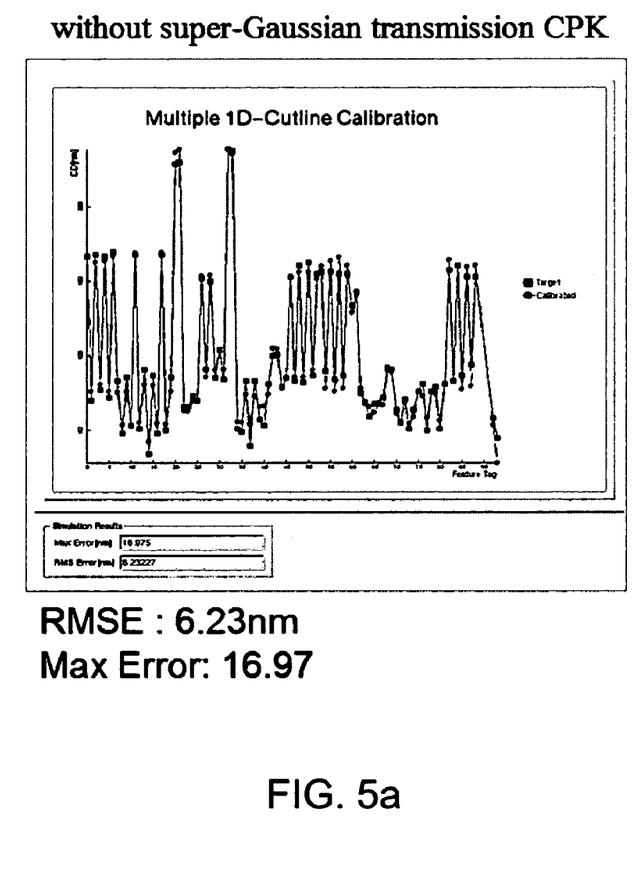
FIGS. 5a and 5b illustrate exemplary resist calibration results without utilizing a calibrated pupil kernel (see, FIG. 5a) and utilizing a calibrated pupil kernel (see, FIG. 5b).
Figure 5B:
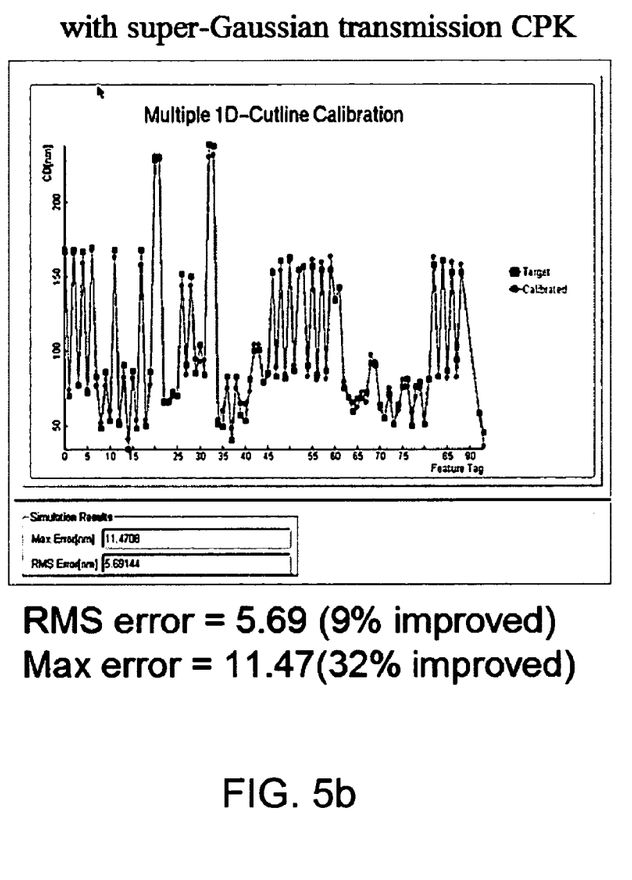

FIG. 4 illustrates exemplary simulation results of a super-Gaussian transmission CPK with different orders for a line-space test pattern. FIGS. 5a and 5b illustrate resist calibration results without utilizing a calibrated pupil kernel (see, FIG. 5a) and utilizing a calibrated pupil kernel (see, FIG. 5b). As shown, the resist calibration results are more accurate for the case utilizing the calibrated pupil kernel (i.e., a 9% improvement in the RMS error, and a 32% improvement in the Max. error).

The use of a calibrated pupil kernel (CPK) in the modeling process provides significant advantages over prior art simulation processes. For example, a CPK can be used in an OPC process with no computational penalty. More specifically, the CPK can be readily utilized in the calculation of the TCC function representing the imaging process. As is clear, a TCC function incorporating a CPK will be different from a TCC obtained without the use of the CPK. Further, if an SOCS approximation is being utilized, the kernels obtained will also be modified, but the speed of simulation will be the same.

Another advantage is that a CPK can be used to correctly model HV-bias. Conventional lens models do not accurately predict HV-bias, which nevertheless is a real-world phenomenon. By calibrating the CPK to data reflecting this phenomenon, it is possible to improve the performance of the model. Another advantage is that a CPK can be utilized in proximity matching to model a scanner that produces different CD values from the expected values.

Figure 6:
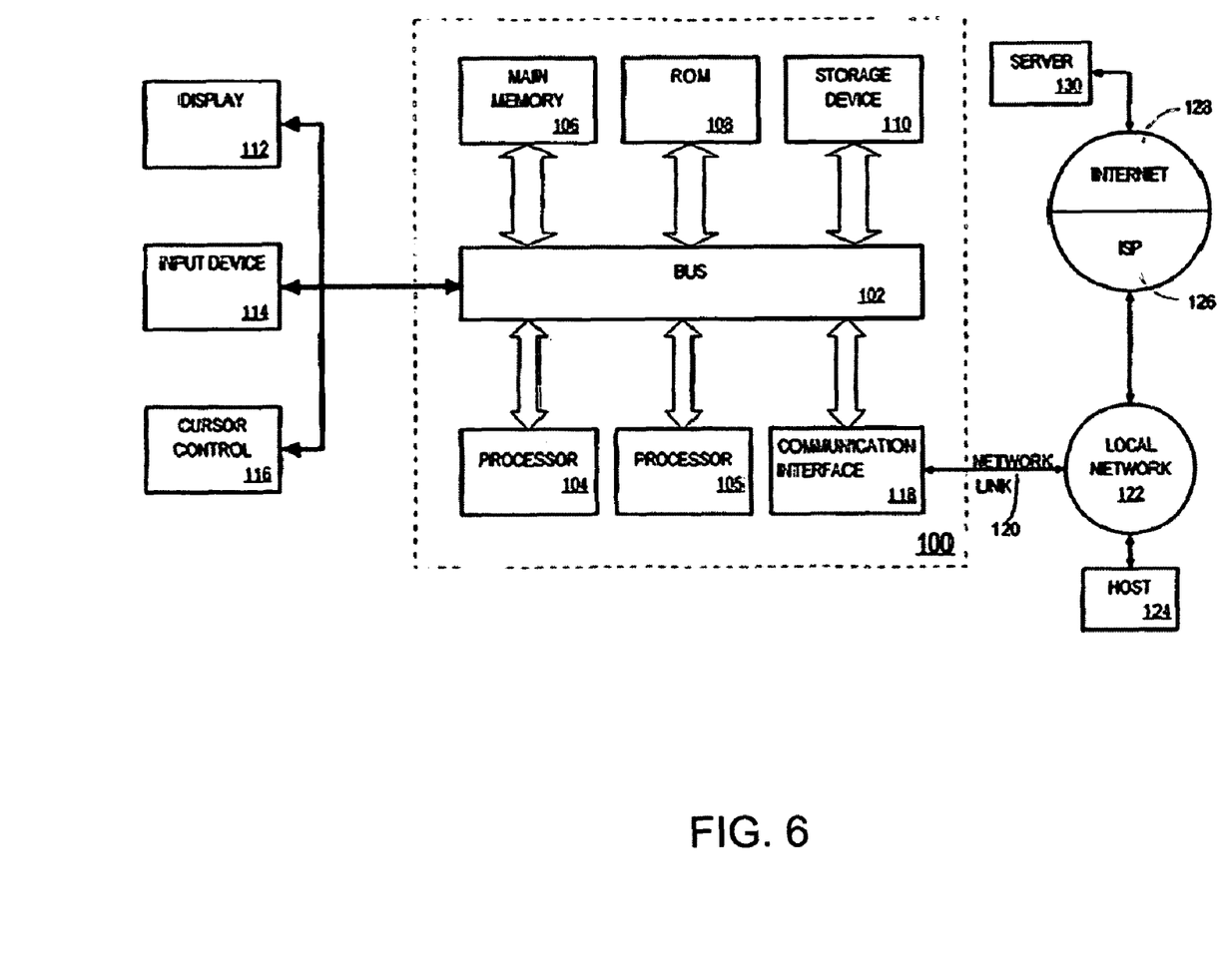
FIG. 6 is a block diagram that illustrates a computer system 100 which can assist in the generation of a model of an optical imaging system which incorporates a linear model of the resist performance in accordance with the present invention.

FIG. 6 is a block diagram that illustrates a computer system 100 which can assist in the generation and use of a CPK in accordance with the present invention. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

Determination and calibration of the CPK may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the determination of the calibration test patterns. The received code may be executed by processor 104 as it is received, and/or stored in storage device 110, or other non-volatile storage for later execution. In this manner, computer system 100 may obtain application code in the form of a carrier wave. generating a model of an optical imaging system which incorporates a non-linear model of the resist performance in accordance with the present invention.

Figure 7:
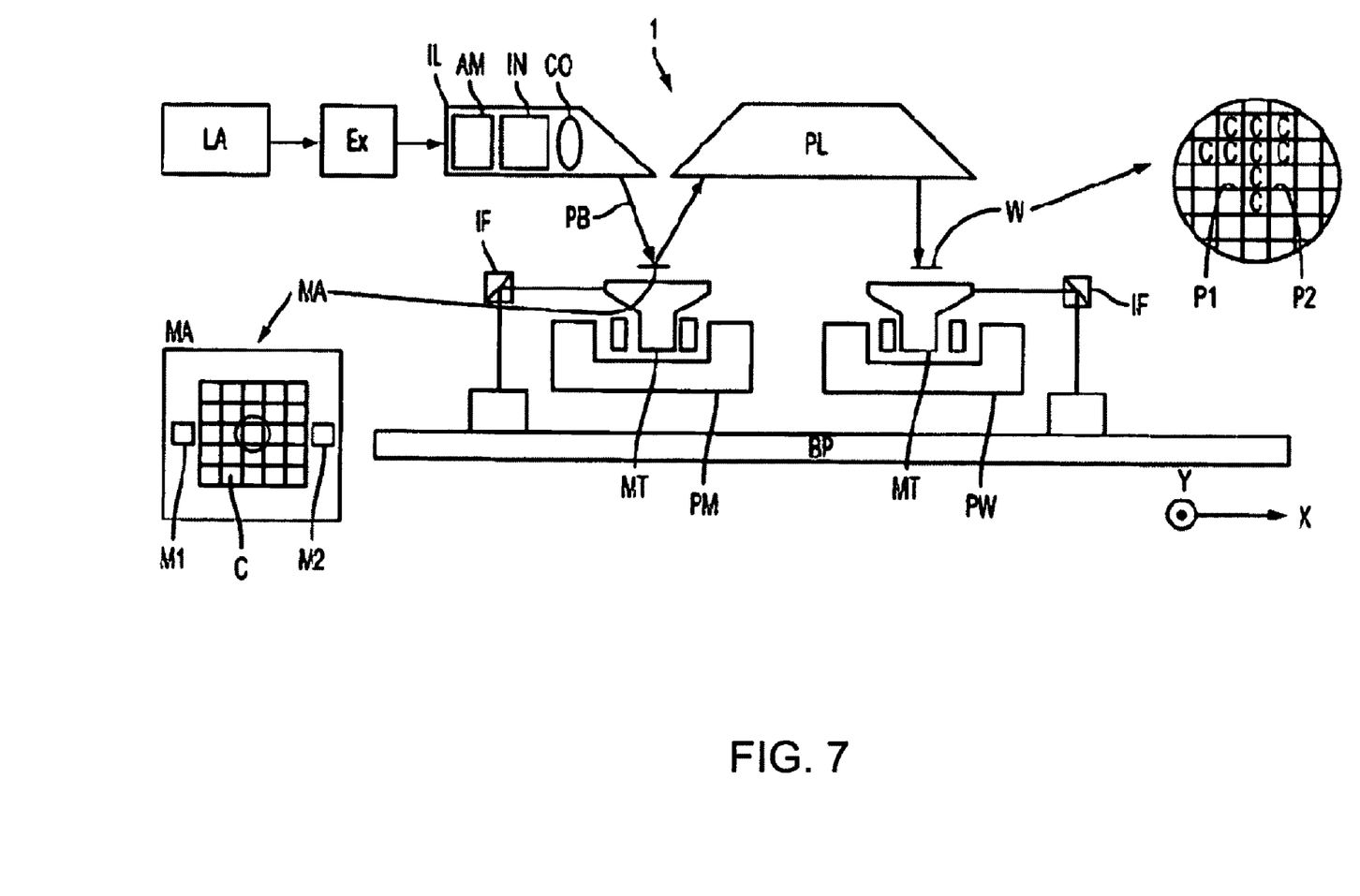
FIG. 7 schematically depicts an exemplary lithographic projection apparatus that could be the basis of the imaging model to be developed and calibrated in accordance with the process of the present invention.

FIG. 7 schematically depicts an exemplary lithographic projection apparatus that could be the basis of the imaging model and CPK to be developed and calibrated in accordance with the process of the present invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 7 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the mask table MT may just be connected to a short stroke actuator, or may be fixed.

The depicted tool can be used in two different modes:
In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the apparatus disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of generating a model for simulating an imaging performance of an optical imaging system having an illumination stage that illuminates a mask, and a pupil that projects the illumination from the mask to a substrate stage, said method comprising the steps of:
    defining said optical imaging system and a process to be utilized by said optical imaging system;
    identifying one or more existing model associated with said optical imaging system and said process;
    defining a functional representation of said pupil;
    modifying said functional representation of said pupil by calibrating with said one or more existing model to generate a calibrated pupil kernel, wherein said calibrated pupil kernel represents a model of the pupil performance;
    defining a model equation including said calibrated pupil kernel, wherein said model equation represents said optical imaging system and said process; and
    generating said simulation model using said model equation to simulate said imaging performance of said optical imaging system.

2. The method of generating a model for simulating the imaging performance of an optical imaging system having a pupil according to claim 1, wherein said calibrated pupil kernel is represented in said model equation utilizing a parametric representation.

3. The method of generating a model for simulating the imaging performance of an optical imaging system having a pupil according to claim 1, wherein said calibrated pupil kernel is represented in said model equation utilizing a pixel based representation.

4. The method of claim 3, wherein in the pixel-based representation, a transmittance value and a phase shift for each pixel are determined during calibration.

5. The method of claim 1, wherein the calibrated pupil kernel comprises a quasi-physical function utilized for improving resist calibration accuracy.

6. The method of claim 1, wherein the calibrated pupil kernel compensates for inaccuracies in one or more of mask representation, mask model, and pupil model.

7. The method of claim 1, wherein the calibrated pupil kernel is a spatial function of illumination angle.

8. The method of claim 1, wherein the functional representation of the pupil includes an empirical pupil filter that represented deviations of the pupil's performance from a simple step function behavior.

9. The method of claim 1, wherein the functional representation of the pupil includes mask error correction factors that arc not considered in a mask model.

10. The method of claim 1, wherein the one or more existing model used for calibration includes a resist model.

11. The method of claim 1, wherein the model of the pupil performance represented by the calibrated pupil kernel comprises a linear model.

12. A method of simulating an imaging performance of an optical imaging system having an illumination stage that illuminates a mask, and a pupil that projects the illumination from the mask to a substrate stage, said method comprising the steps of:
   defining said optical imaging system and a process to be utilized by said optical imaging system;
   identifying one or more existing model associated with said optical imaging system and said process;
   defining a functional representation of said pupil;
   modifying said functional representation of said pupil by calibrating with said one or more existing model to generate a calibrated pupil kernel, wherein said calibrated pupil kernel represents a model of the pupil performance;
   defining a model equation including said calibrated pupil kernel, wherein said model equation represents said optical imaging system and said process;
   generating a simulation model using said model equation; and
   processing a target pattern utilizing said simulation model so as to simulate said imaging performance of said optical imaging system.

13. The method of simulating the imaging performance of an optical imaging system having a pupil according to claim 12, wherein said calibrated pupil kernel is represented in said model equation utilizing a parametric representation.

14. The method of simulating the imaging performance of an optical imaging system having a pupil according to claim 12, wherein said calibrated pupil kernel is represented in said model equation utilizing a pixel based representation.

15. The method of claim 12, wherein the one or more existing model used for calibration includes a resist model.

16. The method of claim 12, wherein the model of the pupil performance represented by the calibrated pupil kernel comprises a linear model.

17. A non-transitory computer readable medium bearing a computer program for generating a model for simulating an imaging performance of an optical imaging system having an illumination stage that illuminates a mask, and a pupil that projects the illumination from the mask to a substrate stage, the computer program, when executed, causing a computer to perform the steps of:
   defining said optical imaging system and a process to be utilized by said optical imaging system;
   identifying one or more existing model associated with said optical imaging system and said process;
   defining a functional representation of said pupil;
   modifying said functional representation of said pupil by calibrating with said one or more existing model to generate a calibrated pupil kernel, wherein said calibrated pupil kernel represents a model of the pupil performance;
   defining a model equation including a calibrated pupil kernel, wherein said model equation represents said optical imaging system and said process; and
   generating said simulation model using said model equation to simulate said imaging performance of said optical imaging system.

18. The non-transitory computer readable medium according to claim 17, wherein said calibrated pupil kernel is represented in said model equation utilizing a parametric representation.

19. The non-transitory computer readable medium according to claim 17, wherein said calibrated pupil kernel is represented in said model equation utilizing a pixel based representation.

20. The method of claim 17, wherein the one or more existing model used for calibration includes a resist model.

21. The method of claim 17, wherein the model of the pupil performance represented by the calibrated pupil kernel comprises a linear model.

* * * * *